(12) United States Patent
Plett

(10) Patent No.: US 7,656,123 B2
(45) Date of Patent: Feb. 2, 2010

(54) SYSTEM, METHOD, AND ARTICLE OF MANUFACTURE FOR DETERMINING AN ESTIMATED BATTERY STATE VECTOR

(75) Inventor: Gregory L Plett, Colorado Springs, CO (US)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 12/243,616

(22) Filed: Oct. 1, 2008

(65) Prior Publication Data

US 2009/0037125 A1    Feb. 5, 2009

Related U.S. Application Data

(62) Division of application No. 11/272,371, filed on Nov. 10, 2005, now Pat. No. 7,446,504.

(51) Int. Cl.
*H02J 7/00* (2006.01)
*G01R 31/36* (2006.01)

(52) U.S. Cl. .......................................... 320/132; 702/63

(58) Field of Classification Search ................. 320/132, 320/127, 128, 149, DIG. 21; 324/430, 433, 324/427, 434; 702/63, 64, 65, 83, 111, 146, 702/147, 181, 182, 190, 191, 192, 193, 194, 702/195, 199
See application file for complete search history.

(56) References Cited

U.S. PATENT DOCUMENTS

| 4,390,841 | A | 6/1983 | Martin et al. |
|---|---|---|---|
| 6,353,815 | B1 | 3/2002 | Vilim et al. |
| 6,515,454 | B2 | 2/2003 | Schoch |
| 6,534,954 | B1 | 3/2003 | Plett |
| 6,927,554 | B2 | 8/2005 | Tate et al. |
| 7,061,246 | B2 | 6/2006 | Dougherty et al. |
| 7,253,587 | B2 | 8/2007 | Meissner |
| 2001/0035739 | A1 | 11/2001 | Laig-Horstebrock et al. |
| 2002/0130637 | A1 | 9/2002 | Schoch |
| 2003/0052690 | A1 | 3/2003 | Schoch |
| 2005/0046388 | A1 | 3/2005 | Tate et al. |
| 2005/0100786 | A1 | 5/2005 | Ryu |
| 2005/0127874 | A1 | 6/2005 | Lim |
| 2007/0035307 | A1 | 2/2007 | Schoch |
| 2008/0249726 | A1* | 10/2008 | Plett ........................... 702/63 |

OTHER PUBLICATIONS

Gregory L. Plett, Extended Kalman Filtering for battery Management Systems of LiPB-based HEV Battery Packs Part 3. State and Parameter Estimation, May 28, 2005, Journal of Power Sources 134 (2004) 277-292.
Pending U.S. Appl. No. 11/209,453, filed Aug. 23, 2005.

\* cited by examiner

*Primary Examiner*—Edward Tso
*Assistant Examiner*—M'Baye Diao
(74) *Attorney, Agent, or Firm*—Cantor Colburn LLP

(57) ABSTRACT

A system, a method, and an article of manufacture for determining an estimated battery state vector indicative of a state of a battery are provided. The method determines a first estimated battery state vector indicative of the state of the battery at a first predetermined time based on a plurality of predicted battery state vectors, a plurality of predicted battery output vectors, and a first battery output vector.

2 Claims, 9 Drawing Sheets

(B)

74 — COMPUTER DETERMINES A PREDICTED BATTERY STATE VECTOR $\hat{x}_k^-$ CORRESPONDING TO THE FIRST TIME BY CALCULATING A WEIGHTED AVERAGE OF THE PLURALITY OF PREDICTED BATTERY STATE VECTORS $X_{k,i}^{x,-}$ UTILIZING THE FOLLOWING EQUATION $$\hat{x}_k^- = \sum_{i=0}^{p} a_i^{(m)} X_{k,i}^{x,-}$$

WHERE, $a_i^{(m)}$ CORRESPONDS TO A SET OF CONSTANT VALUES; AND $p$ CORRESPONDS TO THE NUMBER OF MEMBERS IN THE PLURALITY $X_{k,i}^{x,-}$ MINUS ONE

76 — COMPUTER DETERMINES A PREDICTED BATTERY STATE VECTOR COVARIANCE MATRIX $\Sigma_{\tilde{x},k}^-$ UTILIZING THE FOLLOWING EQUATION $$\Sigma_{\tilde{x},k}^- = \sum_{i=0}^{p} a_i^{(c)} (X_{k,i}^{x,-} - \hat{x}_k^-)(X_{k,i}^{x,-} - \hat{x}_k^-)^T$$

WHERE $a_i^{(c)}$ CORRESPONDS TO A SET OF CONSTANT VALUES

78 — COMPUTER DETERMINES A PREDICTED BATTERY OUTPUT VECTOR $\hat{y}_k$ INDICATIVE OF OUTPUTS OF THE BATTERY AT THE FIRST PREDETERMINED TIME, UTILIZING THE FOLLOWING EQUATION:

$$\hat{y}_k = \sum_{i=0}^{p} a_i^{(m)} Y_{k,i}$$

80 — COMPUTER DETERMINES A PREDICTED BATTERY OUTPUT VECTOR COVARIANCE MATRIX $\Sigma_{\tilde{y},k}^-$ UTILIZING THE FOLLOWING EQUATION:

$$\Sigma_{\tilde{y},k}^- = \sum_{i=0}^{p} a_i^{(c)} (Y_{k,i} - \hat{y}_k)(Y_{k,i} - \hat{y}_k)^T$$

82 — COMPUTER DETERMINES A PREDICTED CROSS-COVARIANCE MATRIX $\Sigma_{\tilde{x}\tilde{y},k}^-$ UTILIZING THE FOLLOWING EQUATION:

$$\Sigma_{\tilde{x}\tilde{y},k}^- = \sum_{i=0}^{p} a_i^{(c)} (X_{k,i}^{x,-} - \hat{x}_k^-)(Y_{k,i} - \hat{y}_k)^T$$

114 — COMPUTER DETERMINES A PREDICTED BATTERY STATE VECTOR $\hat{x}_k^-$ CORRESPONDING TO THE FIRST TIME BY CALCULATING A WEIGHTED AVERAGE OF THE PLURALITY OF PREDICTED BATTERY STATE VECTORS $X_{k,i}^{x,-}$, UTILIZING THE FOLLOWING EQUATION $$\hat{x}_k^- = \sum_{i=0}^{p} a_i^{(m)} X_{k,i}^{x,-}$$

WHERE,
  $a_i^{(m)}$ CORRESPONDS TO A SET OF CONSTANT VALUES; AND
  $p$ CORRESPONDS TO THE NUMBER OF MEMBERS IN THE PLURALITY $X_{k,i}^{x,-}$ MINUS ONE

116 — COMPUTER DETERMINES A PREDICTED BATTERY STATE VECTOR COVARIANCE MATRIX $S_{\tilde{x},k}^-$ UTILIZING THE FOLLOWING EQUATION $$S_{\tilde{x},k}^- = \text{qr}\left\{ \left[ \sqrt{a_i^{(c)}} (X_{k,(0:p)}^{x,-} - \hat{x}_k^-)^T \right] \right\}^T$$

WHERE $a_i^{(c)}$ CORRESPONDS TO A SET OF CONSTANT VALUES.

$\text{qr}\{\}$ IS A FUNCTION THAT COMPUTES A Q-R MATRIX DECOMPOSITION OF ITS INPUT ARGUMENT AND RETURNS THE UPPER-TRIANGULAR PORTION OF THE R MATRIX

118 — COMPUTER DETERMINES A PREDICTED BATTERY OUTPUT VECTOR $\hat{y}_k$ INDICATIVE OF OUTPUTS OF THE BATTERY AT THE FIRST PREDETERMINED TIME, UTILIZING THE FOLLOWING EQUATION:

$$\hat{y}_k = \sum_{i=0}^{p} a_i^{(m)} Y_{k,i}$$

120 — COMPUTER DETERMINES A PREDICTED BATTERY OUTPUT VECTOR COVARIANCE MATRIX $S_{\tilde{y},k}$ UTILIZING THE FOLLOWING EQUATION:

$$S_{\tilde{y},k} = \text{qr}\left\{ \left[ \sqrt{a_i^{(c)}} (Y_{k,(0:p)} - \hat{y}_k)^T \right] \right\}^T$$

122 — COMPUTER DETERMINES A PREDICTED CROSS-COVARIANCE MATRIX $\Sigma_{\tilde{x}\tilde{y},k}^-$ UTILIZING THE FOLLOWING EQUATION:

$$\Sigma_{\tilde{x}\tilde{y},k}^- = \sum_{i=0}^{p} a_i^{(c)} (X_{k,i}^{x,-} - \hat{x}_k^-)(Y_{k,i} - \hat{y}_k)^T$$

SYSTEM, METHOD, AND ARTICLE OF MANUFACTURE FOR DETERMINING AN ESTIMATED BATTERY STATE VECTOR

This application is a divisional application of U.S. patent application Ser. No. 11/272,371, filed Nov. 10, 2005 now U.S. Pat. No. 7,446,504.

BACKGROUND OF THE INVENTION

Batteries are used in a wide variety of electronic and electrical devices. It is desirable to be able to estimate the internal state of a battery, including a state-of-charge (SOC). The SOC is a value that indicates the present available capacity of the battery that may be used to do work.

Mathematical algorithms have been utilized to determine a state of a battery. The inventor herein, however, has recognized that the mathematical algorithms have been unable to provide a highly accurate estimate of an internal state of a battery because they are not sufficiently optimized for batteries having non-linear operational characteristics. Since batteries generally have non-linear operational characteristics, a more accurate method is needed.

Accordingly, the inventor herein has recognized a need for a system and a method for more accurately determining an estimated battery state.

BRIEF DESCRIPTION OF THE INVENTION

A method for determining an estimated battery state vector indicative of a state of a battery at a first predetermined time in accordance with an exemplary embodiment is provided. The method includes determining a first plurality of estimated augmented battery state vectors that are indicative of a state of the battery, a battery input noise, a sensor noise, an uncertainty of the state of the battery, an uncertainty of the battery input noise, and an uncertainty of the sensor noise at a second predetermined time prior to the first predetermined time. The method further includes determining a second plurality of predicted battery state vectors that are indicative of the state of the battery and an uncertainty of the state of the battery at the first predetermined time based on the first plurality of estimated augmented battery state vectors. The method further includes determining a third plurality of predicted battery output vectors that are indicative of at least one output variable of the battery and an uncertainty of the output variable at the first predetermined time based on the first plurality of estimated augmented battery state vectors and the second plurality of predicted battery state vectors. The method further includes determining a first battery output vector having at least one measured value of a battery output variable. The method further includes determining a first estimated battery state vector indicative of the state of the battery at the first predetermined time based on the second plurality of predicted battery state vectors, the third plurality of predicted battery output vectors, and the first battery output vector.

A system for determining an estimated battery state vector indicative of a state of a battery at a first predetermined time in accordance with another exemplary embodiment is provided. The system includes a sensor configured to generate a first signal indicative of an output variable of the battery. The system further includes a computer operably coupled to the sensor. The computer is configured to determine a first plurality of estimated augmented battery state vectors that are indicative of a state of the battery, a battery input noise, a sensor noise, an uncertainty of the state of the battery, an uncertainty of the battery input noise, and an uncertainty of the sensor noise at a second predetermined time prior to the first predetermined time. The computer is further configured to determine a second plurality of predicted battery state vectors that are indicative of the state of the battery and an uncertainty of the state of the battery at the first predetermined time based on the first plurality of estimated augmented battery state vectors. The computer is further configured to determine a third plurality of predicted battery output vectors that are indicative of an at least one output variable of the battery and an uncertainty of the output variable at the first predetermined time based on the first plurality of estimated augmented battery state vectors and the second plurality of predicted battery state vectors. The computer is further configured to determine a first battery output vector based on the first signal. The computer is further configured to determine a first estimated battery state vector indicative of the state of the battery at the first predetermined time based on the second plurality of predicted battery state vectors, the third plurality of predicted battery output vectors, and the first battery output vector.

An article of manufacture in accordance with another exemplary embodiment is provided. The article of manufacture includes a computer storage medium having a computer program encoded therein for determining an estimated battery state vector indicative of a state of a battery at a first predetermined time. The computer storage medium includes code for determining a first plurality of estimated augmented battery state vectors that are indicative of a state of the battery, a battery input noise, a sensor noise, an uncertainty of the state of the battery, an uncertainty of the battery input noise, and an uncertainty of the sensor noise at a second predetermined time prior to the first predetermined time. The computer storage medium further includes code for determining a second plurality of predicted battery state vectors that are indicative of the state of the battery and an uncertainty of the state of the battery at the first predetermined time based on the first plurality of estimated augmented battery state vectors. The computer storage medium further includes code for determining a third plurality of predicted battery output vectors that are indicative of at least one output variable of the battery and of an uncertainty of the output variable at the first predetermined time based on the first plurality of estimated augmented battery state vectors and the second plurality of predicted battery state vectors. The computer storage medium further includes code for determining a first battery output vector having at least one measured value of a battery output variable. The computer storage medium further includes code for determining a first estimated battery state vector indicative of the state of the battery at the first predetermined time based on the second plurality of predicted battery state vectors, the third plurality of predicted battery output vectors, and the first battery output vector.

Other systems and/or methods according to the embodiments will become or are apparent to one with skill in the art upon review of the following drawings and detailed description. It is intended that all such additional systems and methods be within the scope of the present invention, and be protected by the accompanying claims.

BRIEF DESCRIPTION OF THE DRAWINGS

FIGS. 2-5 are flowcharts of a method for determining an estimated battery state vector in accordance with another exemplary embodiment; and FIGS. 6-9 are flowcharts of a method for determining an estimated battery state vector in accordance with another exemplary embodiment.

DETAILED DESCRIPTION OF THE INVENTION

Figure 1:
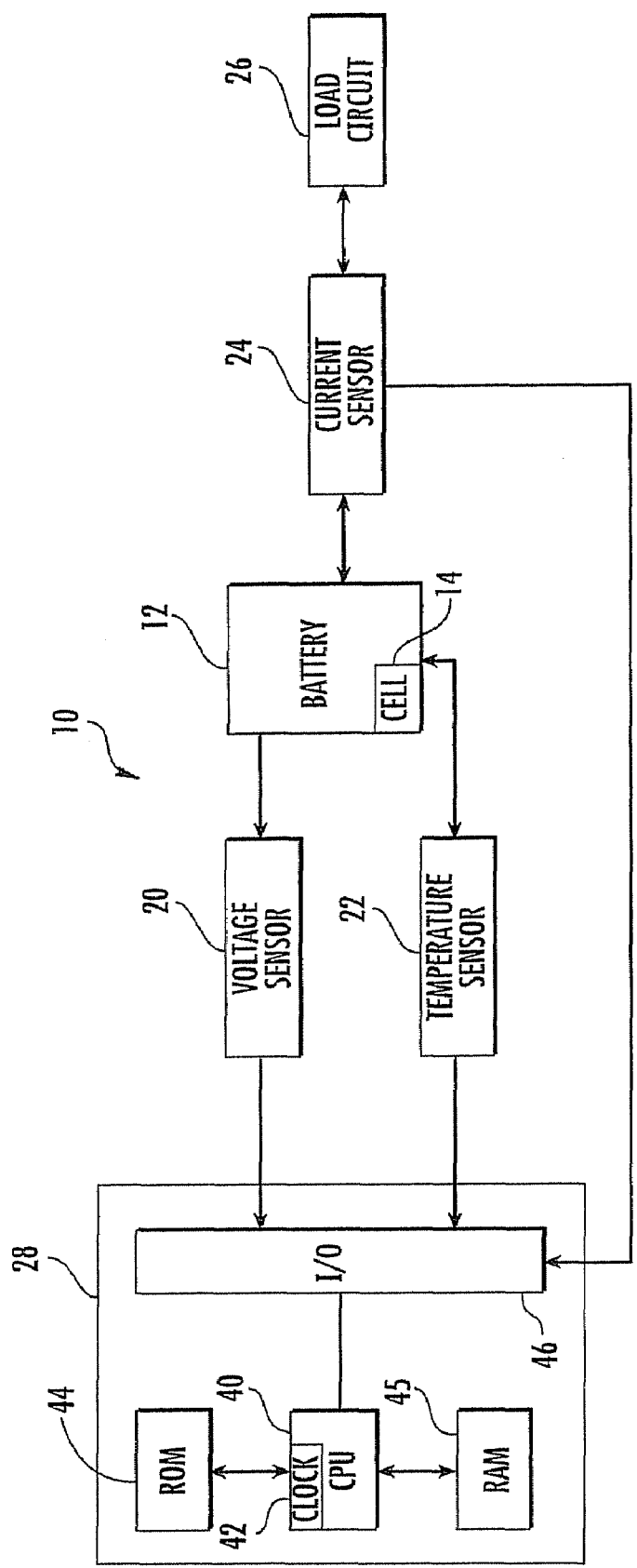
FIG. 1 is a schematic of a system for determining an estimated battery state vector in accordance with an exemplary embodiment.
Figure 2:
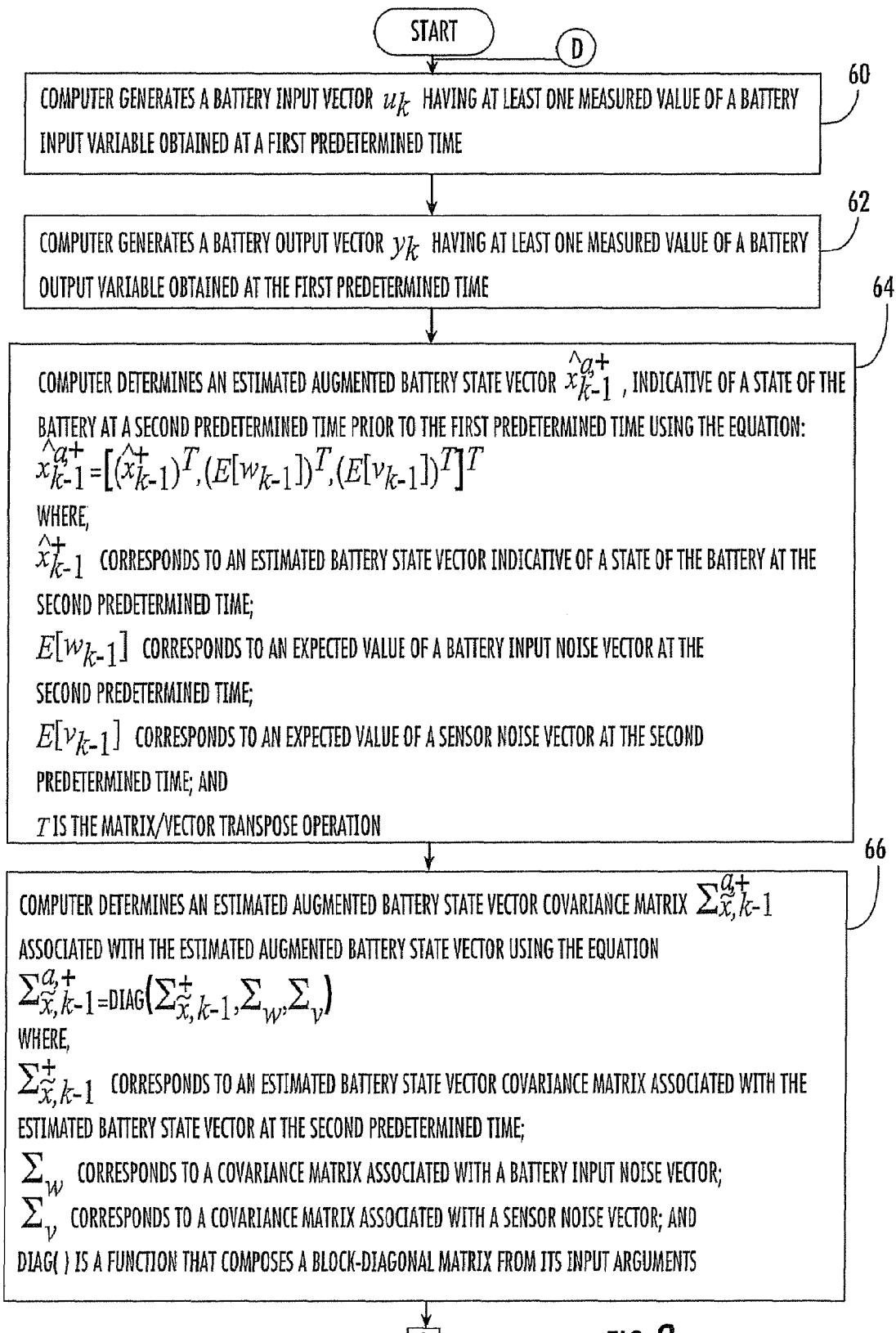
Figure 3:
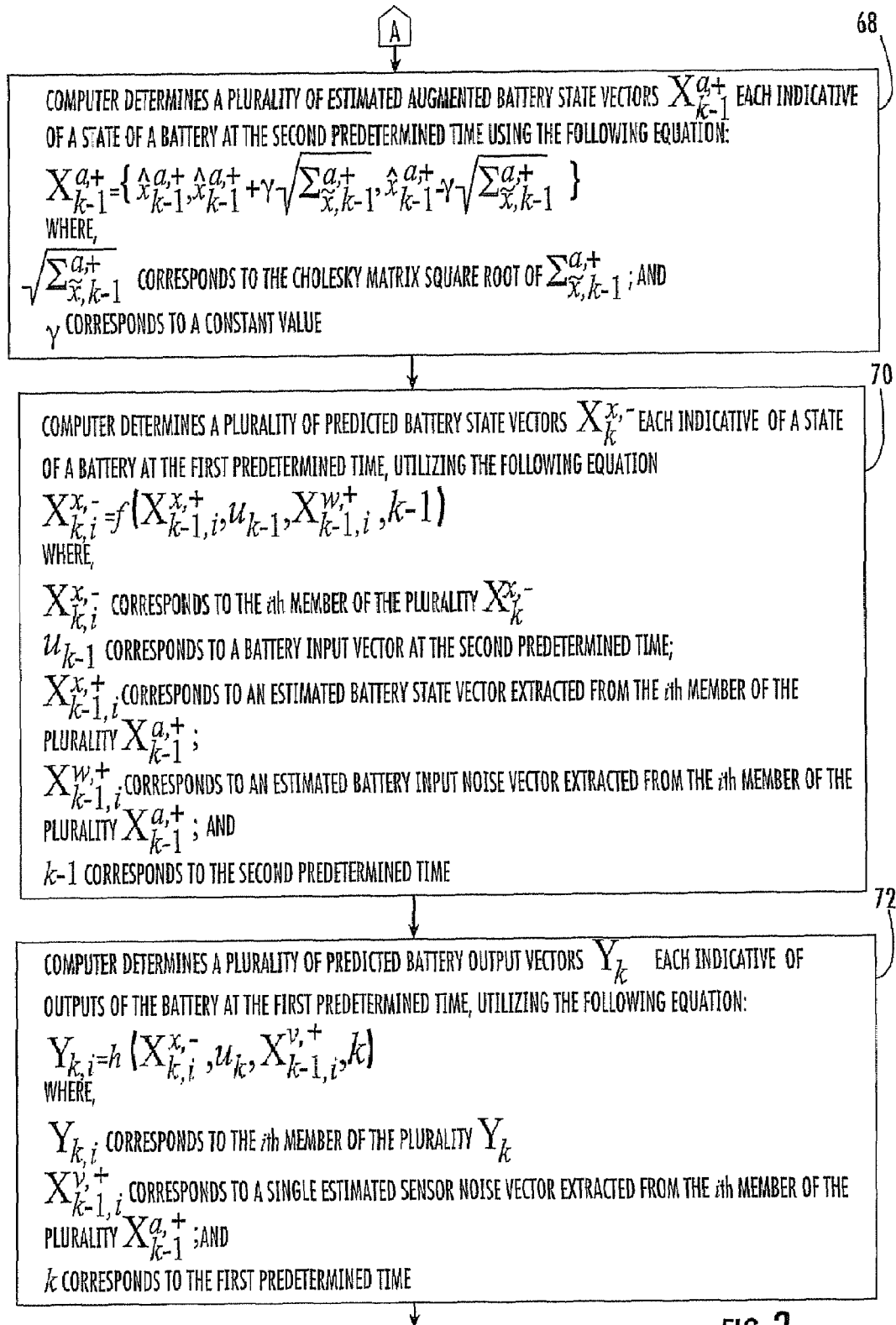
Figure 5:
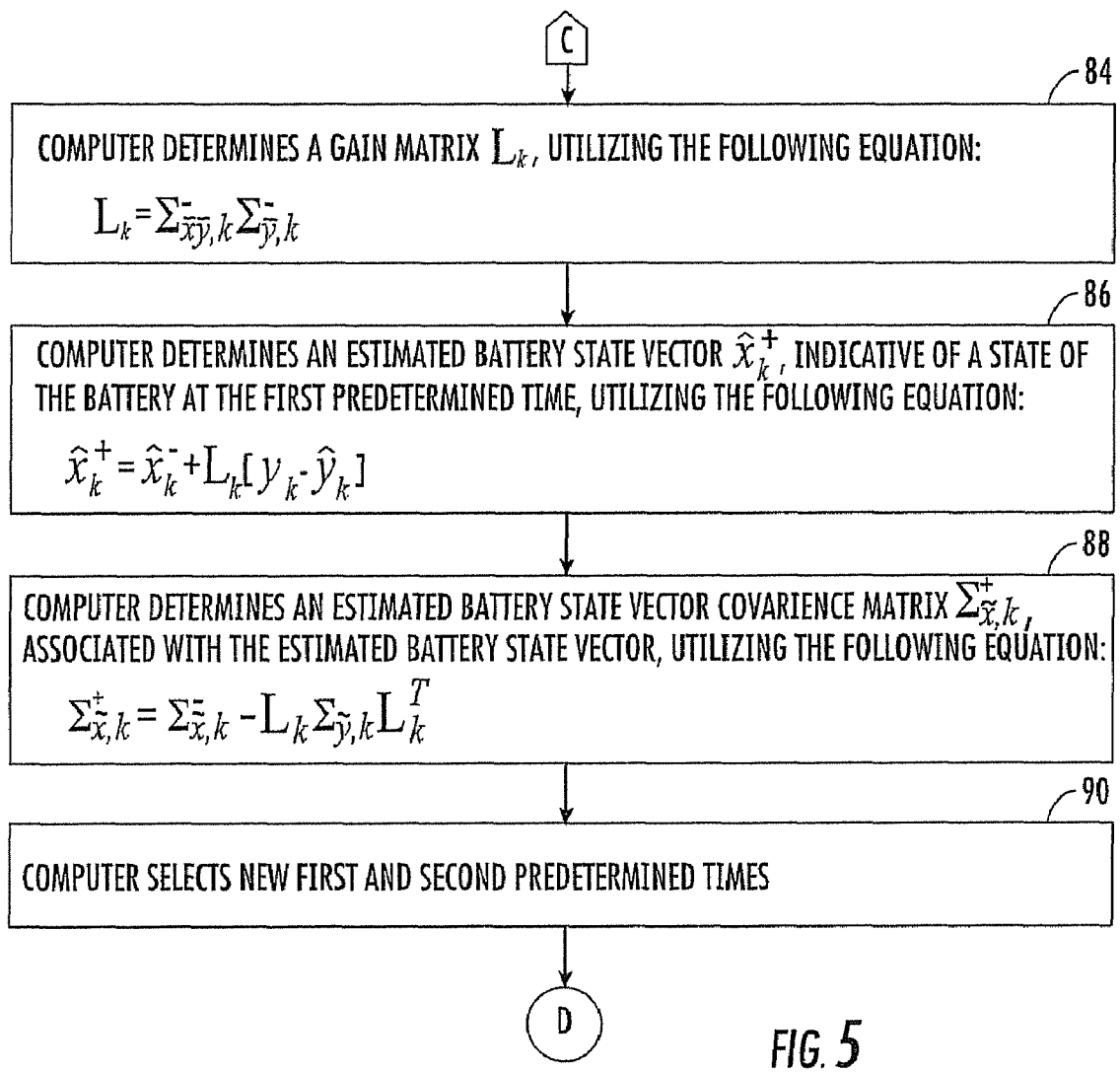
Figure 6:
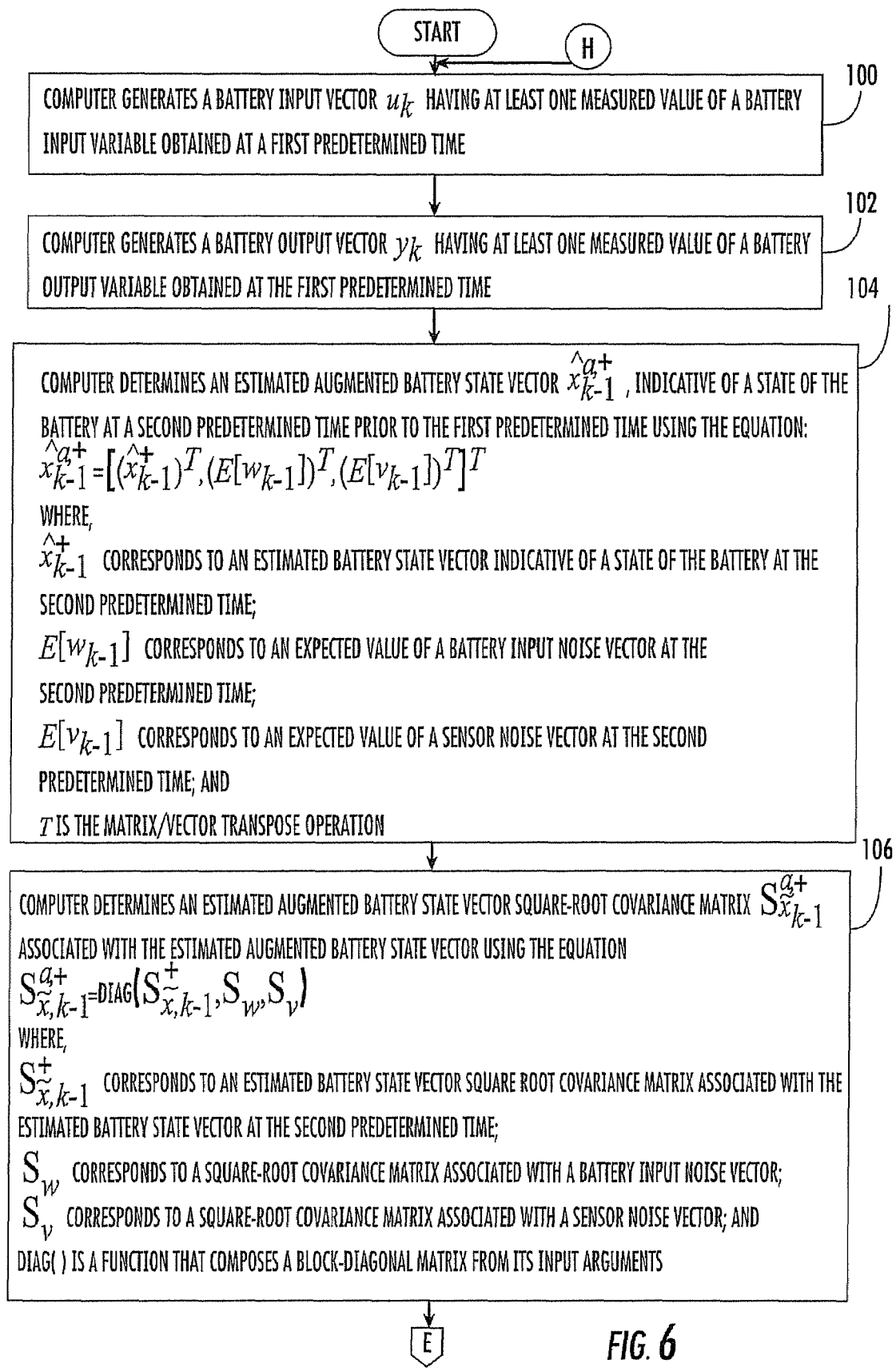
Figure 7:
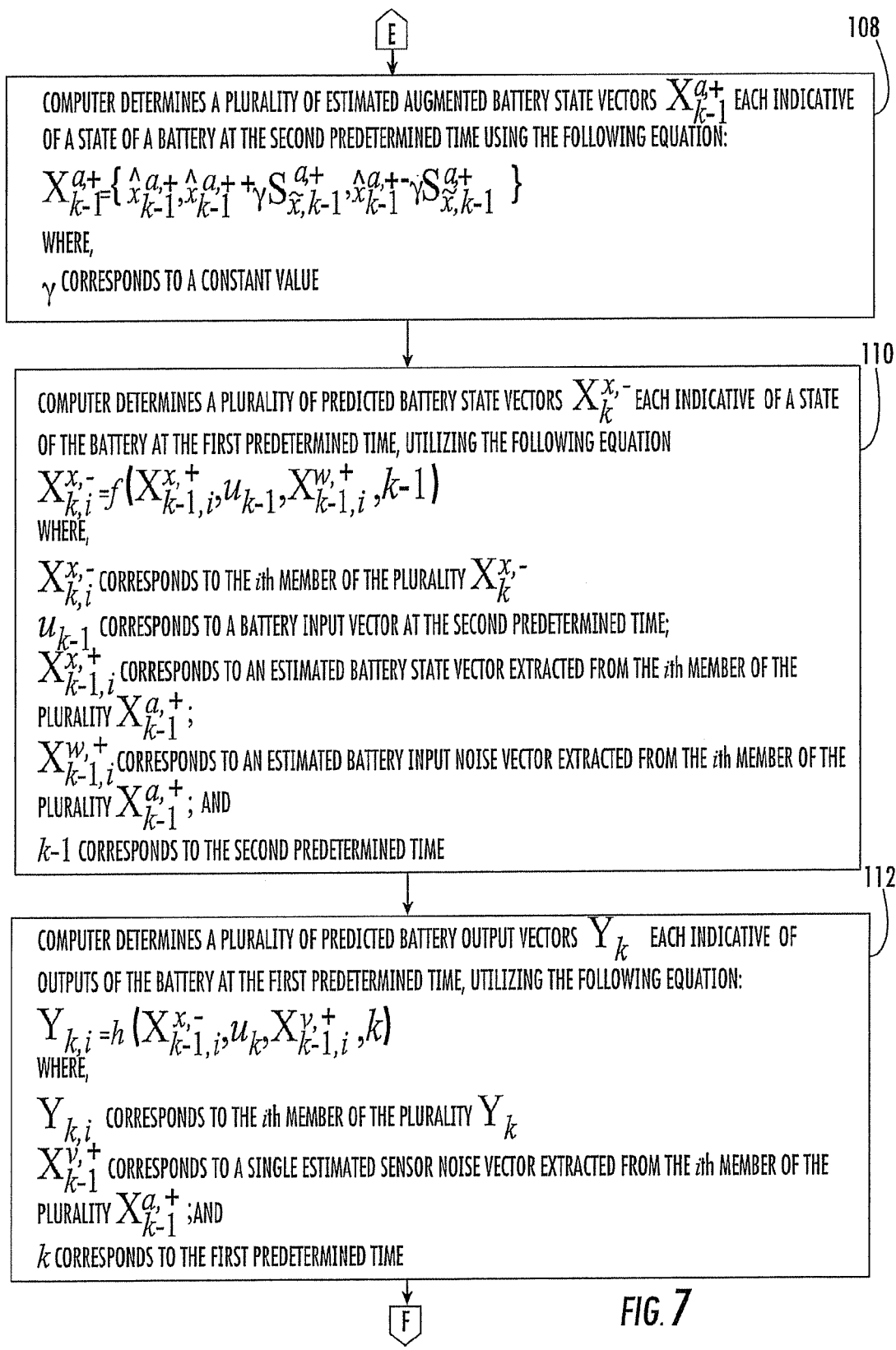
Figure 9:
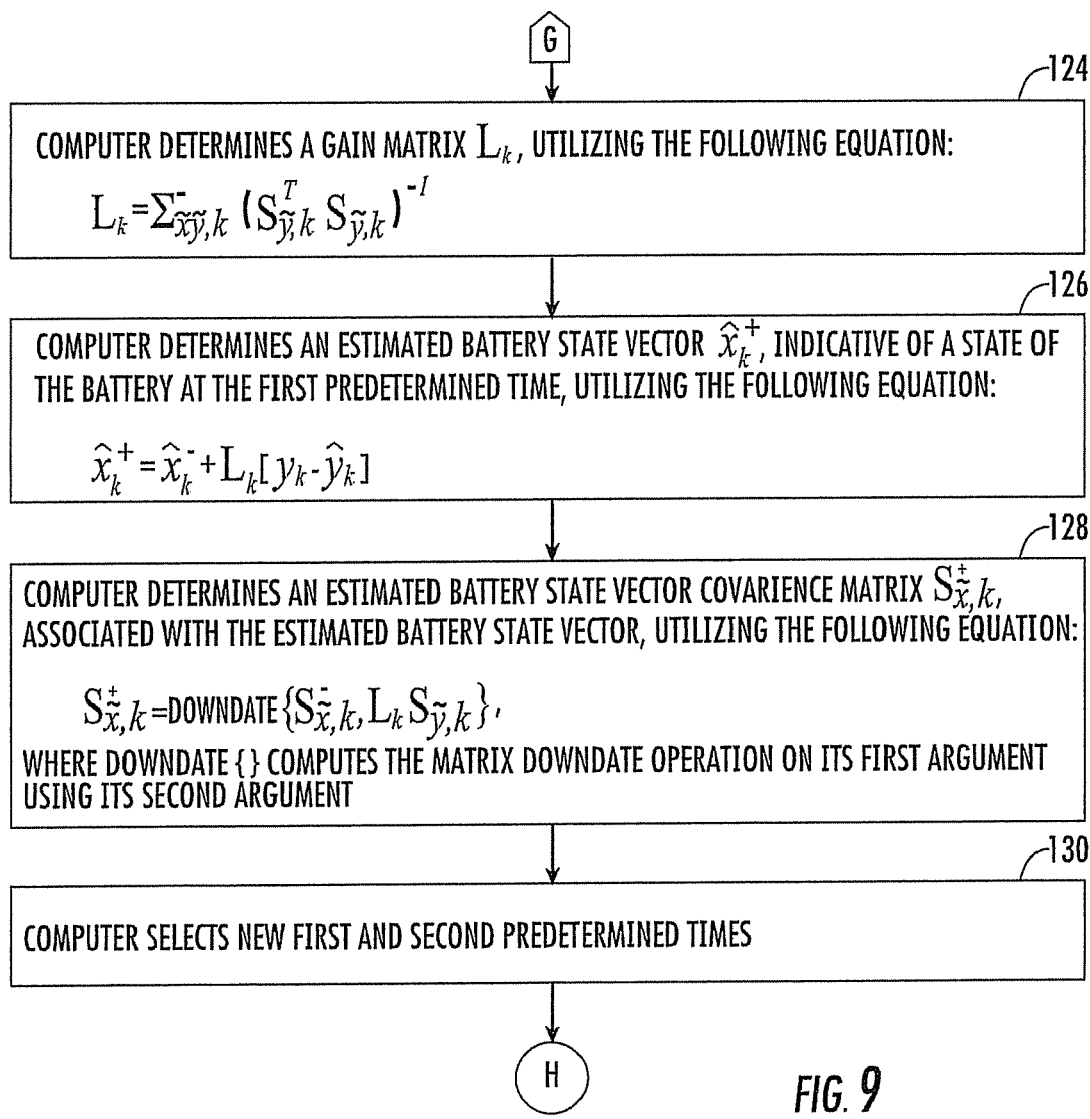

Referring to FIG. 1, a system 10 for estimating a state vector associated with a battery 12 is illustrated. The battery 12 includes at least a battery cell 14. Of course, the battery 12 can include a plurality of additional battery cells. Each battery cell can be either a rechargeable battery cell or a non-rechargeable battery cell. Further, each battery cell can be constructed using an anode and a cathode having electrochemical configurations known to those skilled in the art. An input variable is defined as a value of a battery input signal at a specific time. For example, an input variable can comprise one of a current entering the battery and a temperature of the battery. An output variable is defined as a value of a battery output signal at a specific time. For example, an output variable can comprise one of a battery output voltage and a battery pressure.

The system 10 includes one or more voltage sensors 20, a load circuit 26, and a computational unit such as a computer 28, and may also include one or more of a temperature sensor 22, and a current sensor 24.

The voltage sensor 20 is provided to generate a first output signal indicative of the voltage produced by one or more of the battery cells of the battery 12. The voltage sensor 20 is electrically coupled between the I/O interface 46 of the computer 28 and the battery 12. The voltage sensor 20 transfers the first output signal to the computer 28. For clarity of presentation, a single voltage sensor will be described herein. However, it should be noted that in an alternate embodiment of system 10 a plurality of voltage sensors (e.g., one voltage sensor per battery cell) are utilized in system 10.

The temperature sensor 22 is provided to generate a second output signal indicative of one or more temperatures of the battery 12. The temperature sensor 22 is disposed proximate the battery 12 and is electrically coupled to the I/O interface 46 of the computer 28. The temperature sensor 22 transfers the second output signal to the computer 28. For clarity of presentation, a single temperature sensor will be described herein. However, it should be noted that in an alternate embodiment of system 10 a plurality of temperature sensors (e.g., one temperature sensor per battery cell) are utilized in system 10.

The current sensor 24 is provided to generate a third output signal indicative of a current sourced or sunk by the battery cells of the battery 12. The current sensor 24 is electrically coupled between the battery 12 and the load circuit 26. The current sensor 24 is further electrically coupled to the I/O interface 46 of the computer 28. The current sensor 24 transfers the third output signal to the computer 28.

The load circuit 26 is electrically coupled to the current sensor 24 and sinks or sources a current from the battery 12. The load circuit 26 comprises any electrical device that can be electrically coupled to the battery 12.

The computer 28 is provided for determining an estimated battery state vector associated with the battery 12, as will be explained in greater detail below. The computer 28 includes a central processing unit (CPU) 40, a read-only memory (ROM) 44, a volatile memory such as a random access memory (RAM) 45 and an input/output (I/O) interface 46. The CPU 40 operably communicates with the ROM 44, the RAM 45, and the I/O interface 46. The CPU 40 includes a clock 42. The computer readable media including ROM 44 and RAM 46 may be implemented using any of a number of known memory devices such as PROMs, EPROMs, EEPROMS, flash memory or any other electric, magnetic, optical or combination memory device capable of storing data, some of which represent executable instructions used by the CPU 40.

For purposes of understanding, the notation utilized in the equations of the following methods will be described. The circumflex symbol indicates an estimated or predicted quantity (e.g., $\hat{x}$ indicates an estimate of the true quantity x). The superscript symbol "−" indicates an a priori estimate (i.e., a prediction of a quantity's present value based on past data). The superscript symbol "+" indicates an a posteriori estimate (e.g., $\hat{x}_k^+$ is the estimate of true quantity x at time index k based on all measurements taken up to and including time k). The tilde symbol indicates the error of an estimated quantity (e.g., $\tilde{x}_k^- = x_k - \hat{x}_k^-$ and $\tilde{x}_k^+ = x_k - \hat{x}_k^+$). The symbol $\Sigma_{xy} = E[xy^T]$ indicates the correlation or cross correlation of the variables in its subscript (the quantities described herein are zero-mean, so the correlations are identical to covariances). The symbol $\Sigma_x$ indicates the same quantity as $\Sigma_{xx}$. The superscript "T" is a matrix/vector transpose operator.

Before providing a detailed discussion of the methodologies for determining a state associated with the battery 12, a general overview will be provided. The state vector may include, for example, a state of charge (SOC) value associated with the battery 12, a hysteresis voltage, or a polarization voltage. The SOC value is a value from 0-100 percent, that indicates a present available capacity of the battery 12 that may be used to do work.

A mathematical model of battery cell behavior is used in the method to compute an estimate of the state vector of the battery 12. It is assumed that a mathematical model of the battery cell dynamics is known, and may be expressed using a discrete-time state-space model comprising a state equation and an output equation, as will be described below.

The state equation utilized to determine the state vector associated with the battery 12 is as follows:

$$x_k = f(x_{k-1}, u_{k-1}, w_{k-1}, k-1)$$

wherein, $x_k$ is the state vector associated with the battery 12 at time index k;

$u_k$ is a variable representing a known/deterministic input to the battery 12;

$w_k$ is a battery input noise vector that models some unmeasured input which affects the state of the system; and $f(x_{k-1}, u_{k-1}, w_{k-1}, k-1)$ is a state transition function.

An output vector associated with the battery 12 is determined utilizing the following equation:

$$y_k = h(x_k, u_k, v_k, k)$$

wherein, $h(x_k, u_k, v_k, k)$ is a measurement function; and $v_k$ is sensor noise that affects the measurement of the output of battery 12 in a memory-less mode, but does not affect the state vector of battery 12.

Referring to FIGS. 2-5, a method for determining an estimated battery state vector indicative of a state of the battery 12 in accordance with an exemplary embodiment will now be explained. The method can be implemented utilizing software algorithms executed by the controller 28. The software algorithms are stored in either the ROM 44 or the RAM 45.

At step 60, the computer 28 generates a battery input vector $u_k$ having at least one measured value of a battery input variable obtained at a first predetermined time.

Next at step 62, the computer 28 generates a battery output vector $y_k$ having at least one measured value of a battery output variable obtained at the first predetermined time.

Next at step 64, the computer 28 determines an estimated augmented battery state vector $\hat{x}_{k-1}^{a,+}$, indicative of a state of the battery at a second predetermined time prior to the first predetermined time using the equation:

$$\hat{x}_{k-1}^{a,+} = \left[(\hat{x}_{k-1}^{+})^T, (E[w_{k-1}])^T, (E[v_{k-1}])^T\right]^T$$

where, $\hat{x}_{k-1}^{+}$ corresponds to an estimated battery state vector indicative of a state of the battery at the second predetermined time;

$E[w_{k-1}]$ corresponds to an expected value of a battery input noise vector at the second predetermined time;

$E[v_{k-1}]$ corresponds to an expected value of a sensor noise vector at the second predetermined time; and T is the matrix/vector transpose operation.

Next at step 66, the computer 28 determines an estimated augmented battery state vector covariance matrix $$\Sigma_{\tilde{x},k-1}^{a,+}$$

associated with the estimated augmented battery state vector using the equation:

$$\Sigma_{\tilde{x},k-1}^{a,+} = \text{diag}(\Sigma_{\tilde{x},k-1}^{+}, \Sigma_w, \Sigma_v)$$

where, $$\Sigma_{\tilde{x},k-1}^{+}$$

corresponds to an estimated battery state vector covariance matrix associated with the estimated battery state vector at the second predetermined time;

$\Sigma_w$ corresponds to a covariance matrix associated with a battery input noise vector;

$\Sigma_v$ corresponds to a covariance matrix associated with a sensor noise vector; and diag( ) is a function that composes a block-diagonal matrix from its input arguments.

Next at step 68, the computer 28 determines a plurality of estimated augmented battery state vectors $X_{k-1}^{a,+}$ each indicative of a state of a battery at the second predetermined time using the following equation:

$$X_{k-1}^{a,+} = \left\{\hat{x}_{k-1}^{a,+}, \hat{x}_{k-1}^{a,+} + \gamma\sqrt{\Sigma_{\tilde{x},k-1}^{a,+}}, \hat{x}_{k-1}^{a,+} - \gamma\sqrt{\Sigma_{\tilde{x},k-1}^{a,+}}\right\}$$

where, $$\sqrt{\Sigma_{\tilde{x},k-1}^{a,+}}$$

corresponds to the Cholesky matrix square root of $$\Sigma_{\tilde{x},k-1}^{a,+};$$

and γ corresponds to a constant value.

Next at step 70, the computer 28 determines a plurality of predicted battery state vectors $X_k^{x,-}$ each indicative of a state of the battery at the first predetermined time, utilizing the following equation:

$$X_{k,i}^{x,-} = f(X_{k-1,i}^{x,+}, u_{k-1}, X_{k-1,i}^{w,+}, k-1)$$

where $X_{k,i}^{x,-}$ corresponds to the ith member of the plurality $X_k^{x,-}$ $u_{k-1}$ corresponds to a battery input vector at the second predetermined time;

$X_{k-1,i}^{x,+}$ corresponds to an estimated battery state vector extracted from the ith member of the plurality $X_{k-1}^{a,+}$;

$X_{k-1,i}^{w,+}$ corresponds to an estimated battery input noise vector, extracted from the ith member of the plurality $X_{k-1}^{a,+}$; and k−1 corresponds to the second predetermined time.

Next at step 72, a computer 28 determines a plurality of predicted battery output vectors $Y_k$ each indicative of outputs of the battery at the first predetermined time, utilizing the following equation:

$$Y_{k,i} = h(X_{k,i}^{x,-}, u_k, X_{k-1,i}^{v,+}, k)$$

where, $Y_{k,i}$ corresponds to the ith member of the plurality $Y_k$;

$X_{k-1,i}^{v,+}$ corresponds to a single estimated sensor noise vector extracted from the ith member of the plurality $X_{k-1}^{a,+}$; and k corresponds to the first predetermined time.

Next at step 74, the computer 28 determines a predicted battery state vector $\hat{x}_k^-$ corresponding to the first time by calculating a weighted average of the plurality of predicted battery state vectors $X_k^{x,-}$, utilizing the following equation:

$$\hat{x}_k^- = \sum_{i=0}^{p} \alpha_i^{(m)} X_{k,i}^{x,-}$$

where, $\alpha_i^{(m)}$ corresponds to a set of constant values; and p corresponds to the number of members in the plurality $X_k^{x,-}$, minus one.

Next at step 76, the computer 28 determines a predicted battery state vector covariance matrix $\Sigma_{\tilde{x},k}^-$, utilizing the following equation:

$$\Sigma_{\tilde{x},k}^- = \sum_{i=0}^{p} \alpha_i^{(c)} (X_{k,i}^{x,-} - \hat{x}_k^-)(X_{k,i}^{x,-} - \hat{x}_k^-)^T$$

where, $\alpha_i^{(c)}$ corresponds to a set of constant values.

Next at step 78, the computer 28 determines a predicted battery output vector $\hat{y}_k$ indicative of outputs of the battery at the first predetermined time, utilizing the following equation:

$$\hat{y}_k = \sum_{i=0}^{p} \alpha_i^{(m)} Y_{k,i}.$$

Next at step 80, the computer 28 determines a predicted battery output vector covariance matrix $\Sigma_{\tilde{y},k}$, utilizing the following equation:

$$\Sigma_{\tilde{y},k} = \sum_{i=0}^{p} \alpha_i^{(c)} (Y_{k,i} - \hat{y}_k)(Y_{k,i} - \hat{y}_k)^T.$$

Next at step 82, the computer 28 determines a predicted cross-covariance matrix $\Sigma_{xy,k}^{-}$, utilizing the following equation:

$$\Sigma_{\tilde{x}\tilde{y},k}^{-} = \sum_{i=0}^{p} \alpha_i^{(c)} (X_{k,i}^{x,-} - \hat{x}_k^{-})(Y_{k,i} - \hat{y}_k)^T.$$

Next at step 84, the computer 28 determines a gain matrix $L_k$, utilizing the following equation:

$$L_k = \Sigma_{\tilde{x}\tilde{y},k}^{-} \Sigma_{\tilde{y},k}^{-1}.$$

Next at step 86, the computer 28 determines an estimated battery state vector $\hat{x}_k^{+}$, indicative of a state of the battery at the first predetermined time, utilizing the following equation:

$$\hat{x}_k^{+} = \hat{x}_k^{-} + L_k[y_k - \hat{y}_k].$$

Next at step 88, the computer 28 determines an estimated battery state vector covariance matrix $$\Sigma_{\tilde{x},k}^{+},$$

associated with the estimated battery state vector, utilizing the following equation:

$$\Sigma_{\tilde{x},k}^{+} = \Sigma_{\tilde{x},k}^{-} - L_k \Sigma_{\tilde{y},k} L_k^T.$$

Next at step 90, the computer 28 selects new first and second predetermined times. After step 90, the method returns to step 60.

Referring to FIGS. 6-9, a method for determining an estimated battery state vector indicative of a state of the battery 12 in accordance with another exemplary embodiment will now be explained. The method can be implemented utilizing software algorithms executed by the controller 28. The software algorithms are stored in either the ROM 44 or the RAM 45.

At step 100, the computer 28 generates a battery input vector $u_k$ having at least one measured value of a battery input variable obtained at a first predetermined time.

Next at step 102, the computer 28 generates a battery output vector $y_k$ having at least one measured value of a battery output variable obtained at the first predetermined time.

Next at step 104, computer 28 determines an estimated augmented battery state vector $\hat{x}_{k-1}^{a,+}$, indicative of a state of the battery 12 at a second predetermined time prior to the first predetermined time using the equation:

$$\hat{x}_{k-1}^{a,+} = \left[ (\hat{x}_{k-1}^{+})^T, (E[w_{k-1}])^T, (E[v_{k-1}])^T \right]^T$$

where, $\hat{x}_{k-1}^{+}$ corresponds to an estimated battery state vector indicative of a state of the battery at the second predetermined time;

$E[w_{k-1}]$ corresponds to an expected value of a battery input noise vector at the second predetermined time;

$E[v_{k-1}]$ corresponds to an expected value of a sensor noise vector at the second predetermined time; and T is the matrix/vector transpose operation.

Next at step 106, the computer 28 determines an estimated augmented battery state vector square-root covariance matrix $S_{x,k-1}^{a,+}$ associated with the estimated augmented battery state vector using the equation:

$$S_{x,k-1}^{a,+} = \mathrm{diag}(S_{x,k-1}^{+}, S_w, S_v).$$

where, $S_{x,k-1}^{+}$ corresponds to an estimated battery state vector square-root covariance matrix associated with the estimated battery state vector at the second predetermined time;

$S_w$ corresponds to a square-root covariance matrix associated with a battery input noise vector;

$S_v$ corresponds to a square-root covariance matrix associated with a sensor noise vector; and diag( ) is a function that composes a block-diagonal matrix from its input arguments.

Next at step 108, the computer 28 determines a plurality of estimated augmented battery state vectors $X_{k-1}^{a,+}$ each indicative of a state of a battery at the second predetermined time using the following equation:

$$X_{k-1}^{a,+} = \{\hat{x}_{k-1}^{a,+}, \hat{x}_{k-1}^{a,+} + \gamma S_{x,k-1}^{a,+}, \hat{x}_{k-1}^{a,+} - \gamma S_{\tilde{x},k-1}^{a,+}\}$$

where, γ corresponds to a constant value.

Next at step 110, the computer 28 determines a plurality of predicted battery state vectors $X_k^{x,-}$ each indicative of a state of the battery at the first predetermined time, utilizing the following equation:

$$X_{k,i}^{x,-} = f(X_{k-1,i}^{x,+}, u_{k-1}, X_{k-1,i}^{w,+}, k-1)$$

where $X_{k,i}^{x,-}$ corresponds to the ith member of the plurality $X_k^{x,-}$;

$u_{k-1}$ corresponds to a battery input vector at the second predetermined time;

$X_{k-1,i}^{w,+}$ corresponds to an estimated battery state vector extracted from the ith member of the plurality $X_{k-1}^{a,+}$; and $X_{k-1,i}^{w,+}$ corresponds to an estimated battery input noise vector, extracted from the ith member of the plurality $X_{k-1}^{a,+}$; and k−1 corresponds to the second time.

Next at step 112, the computer 28 determines a plurality of predicted battery output vectors $Y_k$ each indicative of outputs of the battery 12 at the first predetermined time, utilizing the following equation:

$$Y_{k,i} = h(X_{k,i}^{x,-}, u_k, X_{k-1,i}^{v,+}, k)$$

where, $Y_{k,i}$ corresponds to the ith member of the plurality $Y_k$;
$X_{k-1,i}^{v,+}$ corresponds to a single estimated sensor noise vector extracted from the ith member of the plurality $X_{k-1}^{a,+}$; and
k corresponds to the first predetermined time.

Next at step 114, the computer 28 determines a predicted battery state vector $\hat{x}_k^-$ corresponding to the first time by calculating a weighted average of the plurality of predicted battery state vectors $X_k^{x,-}$, utilizing the following equation:

$$\hat{x}_k^- = \sum_{i=0}^{p} \alpha_i^{(m)} X_{k,i}^{x,-}$$

where, $\alpha_i^{(m)}$ corresponds to a set of constant values; and
p corresponds to the number of members in the plurality $X_k^{x,-}$, minus one.

Next at step 116, the computer 28 determines a predicted battery state vector square-root covariance matrix $S_{x,k}^-$, utilizing the following equation:

$$S_{x,k}^- = qr\left\{ \left[ \sqrt{\alpha_i^{(c)}} (X_{k,(0:p)}^{x,-} - \hat{x}_k^-)^T \right] \right\}^T.$$

where, $\alpha_i^{(c)}$ corresponds to a set of constant values.
qr{ } is a function that computes a Q-R matrix decomposition of its input argument and returns the upper-triangular portion of the R matrix.

Next at step 118, computer 28 determines a predicted battery output vector $\hat{y}_k$ indicative of outputs of the battery at the first predetermined time, utilizing the following equation:

$$\hat{y}_k = \sum_{i=0}^{p} \alpha_i^{(m)} Y_{k,i}.$$

Next at step 120, the computer 28 determines a predicted battery output vector square-root covariance matrix $S_{\tilde{y},k}$, utilizing the following equation:

$$S_{\tilde{y},k} = qr\left\{ \left[ \sqrt{\alpha_i^{(c)}} (Y_{k,(0:p)} - \hat{y}_k)^T \right] \right\}^T.$$

Next at step 122, the computer 28 determines a predicted cross-covariance matrix $$\Sigma_{\tilde{x}\tilde{y},k}^-,$$

utilizing the following equation:

$$\Sigma_{\tilde{x}\tilde{y},k}^- = \sum_{i=0}^{p} \alpha_i^{(c)} (X_{k,i}^{x,-} - \hat{x}_k^-)(Y_{k,i} - \hat{y}_k)^T.$$

Next at step 124, the computer 28 determines a gain matrix $L_k$, utilizing the following equation:

$$L_k = \Sigma_{\tilde{x}\tilde{y},k}^- (S_{\tilde{y},k}^T S_{\tilde{y},k})^{-1}.$$

Next at step 126, the computer 28 determines an estimated battery state vector $\hat{x}_k^+$, indicative of a state of the battery at the first predetermined time, utilizing the following equation:

$$\hat{x}_k^+ = \hat{x}_k^- + L_k[y_k - \hat{y}_k].$$

Next at step 128, the computer 28 determines an estimated battery state vector square-root covariance matrix $S_{x,k}^+$, associated with the estimated battery state vector, utilizing the following equation:

$$S_{x,k}^+ = \text{downdate}\{S_{x,k}^-, L_k S_{\tilde{y},k}\},$$

where downdate{ } computes the matrix downdate operation on its first argument using its second argument.

Next at step 130, the computer 28 selects new first and second predetermined times. After step 130, the method advances to step 100.

The system, method, and article of manufacture for determining an estimated battery state vector indicative of the state of a battery provide a substantial advantage over other systems and methods. In particular, the system, method, and article of manufacture provide a technical effect of more accurately determining the estimated battery state vector for a battery having non-linear operational characteristics.

The above-described methods can be embodied in the form of computer program code containing instructions embodied in tangible media, such as floppy diskettes, CD ROMs, hard drives, or any other computer-readable storage medium, wherein, when the computer program code is loaded into and executed by a computer, the computer becomes an apparatus for practicing the invention. The above-described methods can also be embodied in the form of computer program code, for example, whether stored in a storage medium, loaded into and/or executed by a computer, or transmitted over some transmission medium, loaded into and/or executed by a computer, or transmitted over some transmission medium, such as over electrical wiring or cabling, through fiber optics, or via electromagnetic radiation, wherein, when the computer program code is loaded into an executed by a computer, the computer becomes an apparatus for practicing the methods. When implemented on a general-purpose microprocessor, the computer program code segments configure the microprocessor to create specific logic circuits.

While the invention is described with reference to the exemplary embodiments, it will be understood by those skilled in the art that various changes may be made and equivalent elements e may be substituted for elements thereof without departing from the scope of the invention. In addition, many modifications may be made to the teachings of the invention to adapt to a particular situation without departing from the scope thereof. Therefore, is intended that the invention not be limited the embodiment disclosed for carrying out this invention, but that the invention includes all embodiments falling with the scope of the intended claims. More-over, the use of the term's first, second, etc. does not denote any order of importance, but rather the term's first, second, etc. are used to distinguish one element from another.

What is claimed is:

1. An article of manufacture, comprising:
a computer storage medium having a computer program encoded therein for determining an estimated battery state vector indicative of a state of a battery at a first predetermined time, the computer storage medium comprising:
code for determining a first plurality of estimated augmented battery state vectors that are indicative of a state of the battery, a battery input noise, a sensor noise, an uncertainty of the state of the battery, an uncertainty of the battery input noise, and an uncertainty of the sensor noise at a second predetermined time prior to the first predetermined time;
code for determining a second plurality of predicted battery state vectors that are indicative of the state of the battery and an uncertainty of the state of the battery at the first predetermined time based on the first plurality of estimated augmented battery state vectors;
code for determining a third plurality of predicted battery output vectors that are indicative of at least one output variable of the battery and of an uncertainty of the output variable at the first predetermined time based on the first plurality of estimated augmented battery state vectors and the second plurality of predicted battery state vectors;
code for determining a first battery output vector having at least one measured value of a battery output variable; and
code for determining a first estimated battery state vector indicative of the state of the battery at the first predetermined time based on the second plurality of predicted battery state vectors, the third plurality of predicted battery output vectors, and the first battery output vector.

2. The article of manufacture of claim 1, wherein the code for determining the first estimated battery state vector comprises:
code for determining a first predicted battery state vector indicative of the state of the battery at the first predetermined time based on the second plurality of predicted battery state vectors;
code for determining a first predicted battery output vector indicative of at least one output variable of the battery at the first predetermined time based on the third plurality of predicted output vectors;
code for determining a gain matrix based on the first predicted battery state vector, the first predicted battery output vector, the second plurality of predicted battery state vectors, and the third plurality of predicted battery output vectors; and
code for calculating the first estimated battery state vector based on the first predicted battery state vector, the first predicted battery output vector, the gain matrix, and the first battery output vector.

* * * * *